(12) United States Patent
Hsu

(10) Patent No.: US 6,868,025 B2
(45) Date of Patent: Mar. 15, 2005

(54) TEMPERATURE COMPENSATED RRAM CIRCUIT

(75) Inventor: Sheng Teng Hsu, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 0 days.

(21) Appl. No.: 10/384,985

(22) Filed: Mar. 10, 2003

(65) Prior Publication Data

US 2004/0179414 A1 Sep. 16, 2004

(51) Int. Cl.$^7$ .................................. G11C 7/04
(52) U.S. Cl. .......................... 365/211; 365/213
(58) Field of Search .......................... 365/211, 213, 365/171, 173, 158

(56) References Cited

U.S. PATENT DOCUMENTS

| | | | |
|---|---|---|---|
| 5,787,042 A | 7/1998 | Morgan et al. | |
| 5,883,827 A | 3/1999 | Morgan et al. | |
| 6,169,686 B1 | 1/2001 | Brug et al. | |
| 6,185,143 B1 | 2/2001 | Perner et al. | |
| 6,188,615 B1 | 2/2001 | Perner et al. | |
| 6,259,644 B1 | 7/2001 | Tran et al. | |
| 6,262,625 B1 | 7/2001 | Perner et al. | |
| 6,314,014 B1 | 11/2001 | Lowrey et al. | |
| 6,317,375 B1 | 11/2001 | Perner et al. | |
| 6,317,376 B1 | 11/2001 | Tran et al. | |
| 6,341,084 B2 | 1/2002 | Numata et al. | |
| 6,385,082 B1 * | 5/2002 | Abraham et al. | 365/171 |
| 6,385,111 B2 | 5/2002 | Tran et al. | |
| 6,462,979 B2 | 10/2002 | Schlosser et al. | |
| 6,496,051 B1 | 12/2002 | Hsu | |
| 6,504,779 B2 | 1/2003 | Perner et al. | |
| 6,577,549 B1 * | 6/2003 | Tran et al. | 365/211 |
| 6,608,790 B2 * | 8/2003 | Tran et al. | 365/211 |
| 6,735,546 B2 * | 5/2004 | Scheuerlein | 365/211 |
| 6,753,562 B1 * | 6/2004 | Hsu et al. | 257/295 |

* cited by examiner

Primary Examiner—Anh Phung
(74) Attorney, Agent, or Firm—David C. Ripma; Matthew D. Rabdau; Joseph P. Curtin

(57) ABSTRACT

A temperature compensated RRAM sensing circuit to improve the RRAM readability against temperature variations is disclosed. The circuit comprises a temperature dependent element to control the response of a temperature compensated circuit to generate a temperature dependent signal to compensate for the temperature variations of the resistance states of the memory resistors. The temperature dependent element can control the sensing signal supplied to the memory resistor so that the resistance states of the memory resistor are compensated against temperature variations. The temperature dependent element can control the reference signal supplied to the comparison circuit so that the output signal provided by the comparison circuit is compensated against temperature variations. The temperature dependent element is preferably made of the same material and process as the memory resistors.

22 Claims, 21 Drawing Sheets

TEMPERATURE COMPENSATED RRAM CIRCUIT

BACKGROUND OF THE INVENTION

The present invention relates to information storage of integrated circuit memory devices. More specifically, it relates to a temperature compensated resistor memory sensing circuit.

Integrated circuit (IC) memory devices have replaced magnetic-core memory devices due to their lower fabrication cost and higher performance. An IC memory circuit includes a repeated array of memory cells which store one state of a two state information (0 or 1), or multi-state information (for example, 00, 01, 10, or 11 of 4 states), together with support circuitries such as a row decoder, a column decoder, a write circuit to write to the memory cell array, a control circuitry to select the correct memory cell, and a sense amplifier to amplify the signal.

One early memory circuit is a flip-flop that has an output that is stable for only one of two possible voltage levels. The flip-flop maintains a given state for as long as there is power applied to the circuit, and changes state according to some external inputs. Typically, 6 transistors are used in each flip-flop. If the flip-flops are arranged in a circuit in such a way so that the information can be read from any memory cell at random, the circuit is called a SRAM (static random access memory) circuit. And a memory cell that can keep the stored information indefinitely as long as the circuit receives power is called a static memory cell.

The next generation memory cell is a DRAM (dynamic random access memory) cell. A DRAM cell typically consists of a transistor and a capacitor. The capacitor stores information in the form of electrical charge and the transistor provides access to the capacitor. Typically, a charge of one polarity stored in the capacitor represents a binary bit "1", and the charge of the opposite polarity represents a binary bit "0". In contrast to SRAM circuits, the DRAM circuits tend to lose information with time because of the inherent leakage of the capacitor charge, typically through substrate current in the memory circuits. To replenish the charge lost by the leakage, DRAM cells must be rewritten or refreshed at frequent intervals or else the information stored will be lost. A memory cell that requires refreshing at frequent interval is called a dynamic memory cell.

SRAM and DRAM memories cannot retain the stored information without a power source, therefore they belong to a class of memory called volatile memory. Another class of memory is called non-volatile memory which will still retain the stored information even after the power is turned off.

A typical non-volatile memory is ferroelectric random access memory (FRAM). Similar to a DRAM cell, a FRAM cell consists of an access transistor and a storage capacitor. The difference is that FRAM cell uses ferroelectric material for its capacitor dielectric. Ferroelectric material has high dielectric constant and can be polarized by an electric field. The polarization of the ferroelectric material remains until an opposite electrical field reverses it. The lifetime of the polarization of the ferroelectric material is typically about 10 years.

To read the information stored in the ferroelectric capacitor, an electric field is applied to the capacitor. There are more capacitor charges to move if this electric field reverses the cell into the opposite state than if the cell remains in the current state. This can be detected and amplified by a sense amplifier. Because of the possible reversal (or destroying) of the state of the ferroelectric capacitor after being read, the ferroelectric memory cell must be rewritten after a read, similar to a refresh of DRAM cells.

Recent developments of materials that have electrical resistance characteristics that can be changed by external influences have introduced a new kind of non-volatile memory, called RRAM (resistive random access memory). The basic component of a RRAM cell is a variable resistor. The variable resistor can be programmed to have high resistance or low resistance (in two-state memory circuits), or any intermediate resistance value (in multi-state memory circuits). The different resistance values of the RRAM cell represent the information stored in the RRAM circuit.

The advantages of RRAM are the simplicity of the circuit leading to smaller devices, the non-volatile characteristic of the resistor memory cell, and the stability of the memory state.

Since resistor is a passive component and cannot actively influence nearby electrical components, a basic RRAM cell can be just a variable resistor, arranged in a cross point resistor network to form a cross point memory array. To prevent cross talk or parasitic current path, a RRAM cell can further include a diode, and this combination is sometimes called a 1R1D (or 1D1R) cross point memory cell. To provide better access, a RRAM can include an access transistor, as in DRAM or FRAM cell, and this combination is sometimes called a 1R1T (or 1T1R) cross point memory cell.

The resistance state of a RRAM cell is referred to the storing (writing) or sensing (reading) methodology of the RRAM circuit. The term resistance state is related to the resistance value of the memory resistor (the resistance state can then be said to be the resistance of the memory resistor), but sensing the resistance value of the memory resistor often means sensing the voltage across the memory resistor (the resistance state can then be said to be the voltage across the memory resistor), or sensing the current through the memory resistor (the resistance state then can be said to be the current through the memory resistor).

The resistance states of the RRAM can be represented by different techniques such as structural state, polarization, or magnetization.

One example of structural state RRAM is a chalcogenide alloy. The term "chalcogen" refers to the elements in group VI of the periodic table. Chalcogenide alloys contain at least one of these elements such as the alloys of germanium, antimonium, or tellurium. Chalcogenide alloys can exhibit two different stable reversible structural states, namely an amorphous state with high electrical resistance and a polycrystalline state with lower electrical resistance. Since the binary information is represented by two different phases of the material, it is inherently non-volatile and requires no energy to keep the material in either of its two stable structural states. Resistive heating by an electrical current can be used to change the phase of the chalcogenide materials. The information can then be stored (or written) to a chalcogenide material by applying a current pulse to the chalcogenide material. A short pulse of high electrical current will give rise to a high temperature above the melting temperature to form the amorphous state, and a long pulse of lower electrical current will crystallize the material at a lower temperature to form the polycrystalline state. The information can then be sensed (or read) by sensing the voltage across the chalcogenide material using a constant current source, or by sensing the current through the chalcogenide material using a constant voltage source.

One example of polarization state is a polymer memory element. The resistance state of a polymer memory element is dependent upon the orientation of polarization of the polymer molecules. The polarization of a polymer memory element can be written by applying an electric field.

MRAM (magnetic random access memory) is another class of RRAM circuits using magnetic properties for storing information. Materials having perovskite structure such as magnetoresistive (MR) materials, giant magnetoresistive (GMR) materials, colossal magnetoresistive (CMR) materials, or high temperature superconductivity (HTSC) materials can store information by the magnetization state, and the information can be read or sensed by magnetoresistive sensing of such state. HTSC materials such as $PbZr_xTi_{1-x}O_3$, YBCO (Yttrium Barium Copper Oxide, $YBa_2Cu_3O_7$ and its variants), have their main use as a superconductor, but since their conductivity can be affected by an electrical current or a magnetic field, these HTSC materials can also be used as variable resistors in MRAM cells. The resistance of a magnetoresistive material can change depending on the direction of the magnetization vector and the direction of the sensing current (called anisotropic magnetoresistive response). The resistance change of magnetoresistance material can be significantly increased to a giant magnetoresistance effect by a super lattice ferromagnetic/non-ferromagnetic/ferromagnetic/antiferromagnetic layer. The magnetoresistance effect can also be increased with a spin dependent tunneling (SDT) junction. A basic SDT structure consists of two magnetic layers that are separated by a thin insulating film. The change in the magnetization in the two magnetic layers, relative to one another, results in a change in the tunneling current through the insulator. This gives a SDT magnetoresistance. Because the SDT uses tunneling current, the magnetoresistance is much higher than other magnetoresistive materials.

Recent studies on improvements of MRAM cells show that manganate perovskite materials of the $Re_{1-x}Ae_xMnO_3$ structure (Re: rare earth elements, Ae: alkaline earth elements) such as $Pr_{0.7}Ca_{0.3}MnO_3$ (PCMO), $La_{0.7}Ca_{0.3}MnO_3$ (LCMO), $Nd_{0.7}Sr_{0.3}MnO_3$ (NSMO) exhibit an abnormally large magnetoresistance (colossal magnetoresistance effect). $ReMnO_3$ is an antiferromagnetic insulator, and the substitution of an $Ae^{2+}$ ion to a $Re^{3+}$ ion makes the change of $Mn^{3+}$ to $Mn^{4+}$ ionic valance. This results in ferromagnetic ordering and metallic conductivity.

From an electrical circuit point of view, the basic RRAM cell component is still a programmable resistor despite numerous material variations.

Numerous prior art disclosures have addressed the reading circuits of a RRAM cell to improve the reading speed, and to provide better stability against fabrication variations and time degradation. The basic reading scheme is to provide a constant current or a constant voltage to the memory resistor and to sense the corresponding response, e.g. sensing a voltage if a constant current is used, or sensing a current if a constant voltage is used. The corresponding response is then compared to a reference signal to determine the state of the memory resistor. A basic reading circuit using a constant current source is provided in FIG. 1. The constant current source 11 provides a constant current to the memory resistor 10 and generates a voltage $V_{mem}$ 15 across the memory resistor 10. The voltage $V_{mem}$ 15 is compared with a fixed reference voltage $V_{ref}$ 13 (generated by a reference voltage source 17) by a voltage comparator 12, and the output 16 of the voltage comparator 12 is then stored in the register 14. If $V_{mem}$ is higher than $V_{ref}$, a high voltage output is generated and a logic "1" is stored in register 14. If $V_{mem}$ is lower than $V_{ref}$, a low voltage output is generated and a logic "0" is stored in register 14. This basic reading circuit is a simplified schematic circuit. The practical circuit includes other circuit components such as a large memory cell array instead of just a memory resistor, a row decoder, a column decoder, a write circuit to write to the memory cell array, control circuitry to select the correct memory cell resistor, and a sense amplifier to amplify the signal before sending it to the voltage comparator. In this description, the logics "0" and "1" are assumed to correspond to a low voltage (ground potential) and a high voltage (power supply voltage).

Numerous improvements on the basic reading circuits have been disclosed. Brug et al, in U.S. Pat. No. 6,169,686, "Solid-state memory with magnetic storage cells" discloses a basic reading method of applying a read voltage $V_{rd}$ to the selected memory resistor to generate a sense current to a current sense amplifier. The magnitude of the sense current indicates the resistance of the memory cell. Its continuation-in-part in Tran et al, U.S. Pat. No. 6,259,644, "Equipotential sense methods for resistive cross point memory cell arrays" discloses a method using other equal voltages applied to unselected word and bit lines to reduce the parasitic resistance in parallel or in series with the memory resistor.

Schlösser et al, in U.S. Pat. No. 6,462,979 "Integrated memory having memory cells with magnetoresistive storage effect" discloses read amplifier having a capacitor to compensate for any offset voltage at the control inputs of the operational read amplifier to allow data signal to be read comparatively reliably.

Numata et al, in U.S. Pat. No. 6,341,084 "Magnetic random access memory circuit" discloses a high precision and high speed reading of a magnetoresistive element by a charged capacitor to eliminate the possibility of breaking the magnetoresistive element due to excess voltage.

Perner et al. in U.S. Pat. No. 6,504,779, "Resistive cross point memory with on-chip sense amplifier calibration method and apparatus" discloses a RRAM circuit with a calibration controller to ensure that the sense amplifier perform reliably in view of process and geometry variations, and operating temperature and power supply voltage variations. The calibration controller of Perner is aimed at correcting the variations of the sense amplifier.

Perner et al. in U.S. Pat. No. 6,317,375, "Method and apparatus for reading memory cells of a resistive cross point array" discloses a RRAM circuit with a pull-up transistor to force the sense amplifier to a known and consistent condition to improve the reliability of the reading process.

Perner et al. in U.S. Pat. No. 6,262,625, "Operational amplifier with digital offset calibration" and in U.S. Pat. No. 6,188,615, "MRAM device including digital sense amplifier" discloses a direct injection change amplifier circuit which uses the charge time of a capacitor to determine the resistance of the memory cell.

To improve the reliability of the read circuit, numerous methods have also been disclosed with different reference cells.

Perner et al. in U.S. Pat. No. 6,185,143, "Magnetic random access memory (MRAM) device including differential sense amplifier" discloses a differential amplifier used to read the memory resistor. The differential amplifier has two inputs, one from the memory cell and the other from a reference cell. By comparing the two inputs, the differential amplifier generates an output response which is a binary state of the memory resistor. Perner discloses a column of reference cells to distinguish the value of the memory cells. The reference signal from Perner comes from a plurality of reference cells, each of similar construction as a memory cell.

Similarly, Moran et al., in U.S. Pat. No. 5,787,042, "Method and apparatus for reading out a programmable resistor memory" and in U.S. Pat. No. 5,883,827, "Method and apparatus for reading/writing data in a memory system including programmable resistors" discloses a differential amplifier with a reference resistor to read the memory resistor. The reference signal from Moran comes from a fixed resistor.

Tran et al., in U.S. Pat. No. 6,317,376, "Reference signal generation for magnetic random access memory devices" and in its division, U.S. Pat. No. 6,385,111, discloses reference circuits for MRAM devices. The reference circuit comprises 2 reference cells with different resistance states. By taking the average of the reference cells, Tran discloses a MRAM circuit that can tolerate variations in memory resistance due to manufacturing variations and other factors such as temperature gradients across the memory array, electromagnetic interference and aging. The reference signal from Tran also comes from a plurality of reference cells, each of similar construction as a memory cell.

Similarly, Lowrey et al, in U.S. Pat. No. 6,314,014, "Programmable resistance memory array with reference cells" discloses a plurality of reference cells to enhance the stability of the readability of the memory cells. The reference cells may be fabricated from the same material as the memory cells, the variations and drift in resistance values of the memory cells will be tracked and compensated for by the corresponding variations and drift in the reference cells. The reference signal from Lowrey also comes from a plurality of reference cells, each of similar construction as a memory cell.

Lowrey also discloses another method to generate a reference signal. The reference signal is developed by two programmable resistance elements, one programmed to the first resistance state and the other programmed to the second resistance state.

Many prior art RRAM cell reading schemes did not address the temperature dependence of the memory resistor and would be adequate if the memory resistor is temperature independent or if the temperature dependence of the memory resistor is relatively small. However, the memory resistor of a RRAM device can be strongly dependent on temperature. Shown in FIG. 2 is the resistance vs. temperature of a PCMO memory resistor. At high resistance state, the resistance of the PCMO memory resistor can vary from 150 k$\Omega$ at 30° C. to 1.5 k$\Omega$ at 120° C., a hundred times reduction in resistance (FIG. 2a). At low resistance state, the resistance of the PCMO memory resistor can vary from 12 k$\Omega$ at 0.1 V bias at 30° C. to 0.1 k$\Omega$ at 1V bias at 120° C. (FIG. 2b), more than a hundred times reduction in resistance. The resistance of the PCMO memory resistor can be bias voltage independent as in high resistance state (FIG. 2a), or can be bias voltage dependent, as in low resistance state (FIG. 2b), ranging from 1 k$\Omega$ at 1V bias to 12 k$\Omega$ at 0.1 V bias at 30° C. temperature.

The temperature dependence of the PCMO memory resistor creates an overlap in resistance state of the memory resistor from 1.5 k$\Omega$ to 12 k$\Omega$. If the memory resistance falls into this range, without any additional information, the circuit could not determine if the resistance state is a high resistance state or a low resistance state. The prior art constant power source (constant current source or constant voltage source) scheme to read the resistance state of a memory resistor is not adequate because the constant power source did not contain any additional information to resolve the overlapping resistance range of the memory resistor.

FIG. 3 shows a sensing circuit using a constant current load nMOS transistor according to the scheme of FIG. 1. The transistor 30 is biased into a constant current transistor, therefore when the memory resistor 24 is at high resistance state, the voltage across the memory resistor will be high, and the voltage at 28 will be low, and when the memory resistor 24 is at low resistance state, the voltage at 28 will be high. The sensing voltage 28 will be inverted by the inverter 29 and outputs to a register (not shown).

The above sensing circuit comprises 3 sections, a memory resistor section 21 from a memory array, a control circuit 22 to control the reading of the information stored in the memory resistor, and a sensing amplifier 23 to read the information stored in the memory resistor and then store it in a register (not shown).

The memory resistor section 21 includes a memory resistor 24 with a diode 25. The diode 25 is optional. Its main purpose is to reduce or eliminate parasitic current. The polarity of the diode 25 is positioned so that the current runs through the memory resistor.

The sense amplifier 23 includes an inverter 29. The inverter 29 also acts as a voltage comparator with an internal reference voltage. The internal reference voltage is the toggle voltage of the inverter, typically about 0.5V. If the input $V_{in}$ 28 to the inverter 29 is less than the toggle voltage, the output $V_{out}$ 32 of the inverter 29 will be high to the power supply voltage. If the input $V_{in}$ 28 to the inverter 29 is higher than the toggle voltage, the output $V_{out}$ 32 of the inverter 29 will be low to the ground potential. The output response of the inverter is shown in the inset 20 of FIG. 3.

The control circuit 22 includes a constant current load nMOS transistor 30. During a read operation, a memory power supply voltage $V_{cc}$ 26 is applied to the memory resistor 24, and a bias voltage $V_{GC}$ 27 is applied to the transistor 30. The transistor 30 is biased so that it performs as a constant current load nMOS transistor. If the drain voltage 28 is larger than the threshold voltage of the transistor 30, the current 31 flowing through the transistor 30 is a constant value. Also, the drain voltage 28 indicates how much the power supply voltage $V_{cc}$ has dropped across the memory resistor 24.

If the constant current flows through a high resistance memory resistor, the voltage drop is high, thus the drain voltage 28 is low, and the inverter 29 will generate a high state output at the output 32. If the constant current flows through a low resistance memory resistor, the voltage drop is low, thus the drain voltage 28 is high, and the inverter 29 will generate a low state output.

Showing in FIG. 4 is the output response of the sensing circuit in FIG. 3. The output is the response of the transistor current 31 with respect to the transistor drain voltage 28. The voltage coordinate is the memory supply voltage normalized to 1 V. The output response curve consists of 2 segments, a linear segment 41 and a saturation segment 42. With a low drain voltage 28 (less than 0.2 V), the current 31 is essentially linear, and with a large drain voltage 28 (more than 0.2 V), the current 31 is essentially saturated to a constant value, about 35 $\mu$A as shown in FIG. 4. The constant current value of the output response curve depends on the bias voltage $V_{GC}$ 27. A large bias voltage 27 will shift the output response curve up (higher saturation current), and a small bias voltage 27 will shift the output response curve down (lower saturation current).

The various straight lines in FIG. 4 are the load lines for the memory resistor at different resistance states and operating temperatures (high resistance state at 30° C., 60° C., 80° C. and 100° C., low resistance state at 30° C. and 100° C.). The load lines all intersect the point (1V, 0A) because when the normalized drain voltage is at 1V, the drain voltage 28 is at the memory power supply $V_{cc}$, and therefore there is no current through the memory resistor, or the drain current 31 is zero. The slopes of the load lines are the conductance (inverse of the resistance) of the memory resistor at different operating temperatures and resistance states. These load lines are drawn for the PCMO material (shown in FIG. 2), therefore the resistance could depend on the bias voltage. The dependence of the high resistance state to the bias voltage is negligible. For low resistance state, the resistance is a function of the bias voltage, but for simplicity this dependence is not taken into account. Instead, the resistance at the operation point is chosen, such as 0.8 V at 30° C. at which the voltage across the memory resistor is 0.2 V, and a straight line is drawn to represent the 30° C. load line for the low resistance state.

The operation of the above sensing circuit for different temperatures is as followed. Since it is a constant current nMOS load at 30° C., the drain voltage 28 is 0.8 V for low resistance state. With the drain voltage higher than 0.5 V, the output 32 of the inverter 29 is 0 V, which is the ground potential for the memory circuit power supply voltage and represents a "0" state. At higher operating temperatures, the memory resistance at the low resistance state decreases. Therefore the drain voltage 28 increases with increased temperatures. The drain voltage 28 will still be higher than 0.5 V when the temperature increases, therefore there is no problem to sense the memory resistor at low resistance state at all temperature range.

The problem occurs at high resistance state. At low temperature, such as 30° C., the resistance of the high resistance state is very high (order of 100 kΩ). The constant current load nMOS transistor is biased at the linear region 41 as shown in FIG. 4 for the cases of 30° C. and 60° C. The drain voltage 28 in these cases is less than 0.2 V (less than the toggle voltage 0.5 V of the inverter) and therefore the output 32 of the inverter 29 is 1 V, which is the power supply voltage for the memory circuit and represents a "1" state. At higher operating temperature, 80° C. for example, the operating point of the constant current load nMOS transistor is in the saturation region and the load line in FIG. 4 shows a drain voltage of 0.65 V. This voltage is larger than the toggle voltage 0.5 V of the inverter 29; and as a result, the output 32 of the inverter 29 is at ground potential, representing a "0" state. Thus at high temperature, this circuit is not able to detect high resistance state signal.

To enable accurate high resistance state signal detection, the constant current load nMOS transistor can be biased at a higher constant current, such as 180 µA, as shown in FIG. 5. In FIG. 5, the load lines of the memory resistors are the same as in FIG. 4. The only difference is the response of the transistor current 31 with respect to the drain voltage 28. Higher bias voltage $V_{GC}$ results in a higher saturation current. This response is represented by a new output response curve with a linear region 46 and a saturation region 47. The saturation region 47 is biased at 180 µA so the sensing circuit is able to detect the high resistance state at a high temperature of 100° C. At 100° C., the high resistance state load line shows that the drain voltage 28 is 0.25 V, less than the toggle voltage, and therefore the inverter output will generate a high voltage, representing a "1" state. This bias scheme also works for the high temperature low resistance state of 100° C. However, it does not work at low temperature low resistance state. The load line for low resistance state at 30° C. shows a drain voltage 28 at less than 0.2 V, and the inverter will give a high "1" state.

Basically, this circuit can be biased to work at either low temperatures or high temperatures, but not both. Since the resistance of high resistance state at high temperatures overlaps with the resistance of low resistance state at low temperature, this circuit cannot resolve these resistance values and therefore cannot be operated in the entire temperature range.

In this description, the states 0 and 1 are assumed to correspond to a low voltage (ground potential) and a high voltage (power supply voltage). However, this is arbitrarily assigned and the opposite assignment would work equally well.

Shown in FIG. 6 is a complement constant current source pMOS sensing circuit. Similar to a constant current load nMOS sensing circuit, the constant current source pMOS bit sensing circuit comprises 3 sections: a memory resistor section 51 from a memory array, a control circuit 52 to control the reading of the information stored in the memory resistor, and a sensing amplifier 53 to read the information stored in the memory resistor and to store it in a register (not shown). The memory resistor section 51 includes a memory resistor 54 with a diode 55. The memory resistor circuit is connected to ground potential instead of connecting to the power supply voltage $V_{cc}$ as in the case of the constant current load nMOS bit sensing circuit. The sense amplifier 53 is the same as in the case of the constant current load nMOS bit sensing circuit and comprises an inverter 59. The control circuit 52 includes a constant current source pMOS transistor 60 instead of an nMOS transistor as in the case of the constant current load nMOS bit sensing circuit. The operation of the constant current source pMOS bit sensing circuit is similar to that of the constant current load nMOS circuit. The basic difference is the selection of components (pMOS transistor vs. nMOS transistor), and therefore results in a different voltage bias scheme. Similar to the nMOS circuit, this pMOS circuit cannot be operated in the whole operating temperature range due to the overlapping of the resistance of the memory resistor in high resistance/high temperature and low resistance/low temperature states.

Shown in FIG. 7 is a constant current load nMOS transistor sensing circuit for a 1R1T RRAM. The basic difference is the presence of a transistor 65 instead of a diode. A transistor provides more access to the memory resistor at the cost of increasing circuit complexity. Operation of the 1R1T RRAM is similar to the 1R1D RRAM with the gate bias WL of the transistor 65 providing further isolation to the memory resistor, and therefore need to be turned on before accessing the memory resistor. A constant current source pMOS transistor sensing circuit for a 1R1T RRAM is similarly constructed by replacing the diode in FIG. 6 with a transistor. Again, these circuits cannot be operated in the whole operating temperature range due to the overlapping of the resistance of the memory resistor in high resistance/high temperature and low resistance/low temperature states.

Therefore it is advantageous to provide a simple reading circuit for RRAM so that the reading output is correct regardless of the operating temperatures.

It is advantageous to remove the overlapping states of the memory resistors due to variation in operating temperature to provide a reliable reading.

It is advantageous to resolve the various states of the memory resistors due to variation in operating temperature to provide a reliable reading.

SUMMARY OF THE INVENTION

Accordingly, a temperature compensated RRAM sensing circuit is provided. The temperature compensated RRAM sensing circuit comprises a temperature dependent element serving as an input into a control circuit to compensate for the temperature-related resistance drifting of the memory resistors.

It is an objective of the present invention to provide a temperature dependent circuit to compensate for the temperature drifting of the memory resistors.

It is another objective of the present invention to provide a temperature dependent power source to drive the temperature dependent memory resistor to compensate for the temperature drifting of the memory resistors.

It is another objective of the present invention to provide a temperature dependent reference signal so that the signal from the memory resistor is compensated in the operating temperature range.

It is another objective of the present invention to provide a temperature dependent power source together with a temperature dependent reference signal to compensate for the temperature drifting of the memory resistors.

It is an objective of the present invention to provide a temperature dependent control circuit to compensate for the temperature variation of the resistance of the memory resistors. The present invention addresses the prior art method of using a constant control circuit such as a constant current source, in which the resistance variation of the memory resistors due to the temperature variation will just propagate to the voltage variation across the memory resistor.

In one aspect of the invention, the present invention provides a method to sense a resistance state of a selected memory resistor in an RRAM device with readability improvement against temperature variation. The method comprises the steps of
 a) providing a temperature compensated control circuit comprising a temperature dependent element;
 b) developing a temperature dependent sensing signal by the temperature compensated control circuit;
 c) applying the temperature dependent sensing signal to the memory resistor to compensate for the temperature variation of the resistance of the memory resistor; and
 d) sensing the compensated state of the memory resistor.

The compensation of the temperature dependent circuit narrows the spread of the resistance values of the memory resistors due to temperature variations. Large spread of resistance values could create overlapping resistance values, which can make the correct detection of the resistance states impossible. Large spread of the resistance values could create narrowly separated resistance values, which can make the correct detection of the resistance states difficult. The present invention temperature compensated circuit provides a method and apparatus to narrow the variation of the resistance states due to temperature variation to improve the correct detection of resistance states.

FIG. 8 shows a conceptual representation of the temperature compensation in the present invention using a temperature dependent current source. The segments 101 and 102 represent the resistances of the low resistance state and the high resistance state respectively. These segments overlap in the regions of low resistance/low temperature and high resistance/high temperature. A prior art constant current source scheme will project in parallel the resistance segment 101 and 102 into the constant voltage segments 103 and 104. The projection lines are parallel because of the constant current source, and therefore the voltage responses still overlap, preventing the circuit from operating in the whole temperature range. Choosing a reference voltage at 107 will allow the sensing of the resistance values at low temperature, but not at high temperature. Similarly, choosing a reference voltage at 108 will allow the sensing of the resistance values at high temperature, but not at low temperature The present invention temperature dependent current source scheme will project the resistance segment 101 and 102 into the temperature dependent voltage segments 105 and 106. Since the current source is not constant, the projection lines are not parallel. The current source can be designed to generate a higher current at higher temperature to narrow the voltage responses and therefore eliminate the overlapping section of the memory resistor. The degree of separation of the two voltage responses using the temperature dependent current source can further be optimized with a proper design of the temperature dependent current source. Choosing a reference voltage at 107 will allow the sensing of the resistance values at all operating temperatures.

The above conceptual representation of the present invention describes a temperature dependent current source scheme. Similarly, a temperature dependent voltage scheme can be used to compensate for the variation in resistance values of the memory resistors. In contrast to the temperature dependent current scheme where the current increases when the resistance decreases (to achieve a compensated voltage value), in the temperature dependent voltage scheme, the voltage decreases when the resistance decreases (to achieve a compensated current value).

The above conceptual representation of the present invention also describes an inverse response of a resistance with respect to temperature, i.e. the resistance value decreases when the temperature increases. Similarly, the present invention can be used with memory resistor materials where the resistance value increases when the temperature increases.

The above conceptual representation of the present invention is for a two-bit state memory circuit. The compensation scheme of the present invention is also well suited to multi-bit state RRAM circuits. A circuit can take advantage of a smaller variation in resistance states to incorporate addition states without much difficulty. Using a multi-bit state RRAM circuit will require a multi-bit sensing circuit. A typical multi-level sense amplifier is disclosed in the U.S. Pat. No. 6,496,051, "Output sense amplifier for a multibit memory cell", of the same author, and is herein incorporated by reference.

In one aspect of the invention, the present invention provides a temperature compensated control circuit for a RRAM sensing circuit. The temperature dependent control circuit is in communication with a temperature dependent element to generate a temperature dependent sensing signal. The temperature dependent sensing signal is applied to the memory resistor to compensate for the temperature variation of the resistance of the memory resistor.

The temperature dependent sensing signal developed by the temperature compensated control circuit can be a temperature dependent current source with the temperature dependency of the output signal is in the opposite direction of the temperature dependency of the memory resistor, e.g. for increasing temperature, if the memory resistance decreases, the current increases.

The temperature dependent sensing signal developed by the temperature compensated control circuit can be a temperature dependent voltage source with the temperature dependency of the output signal is in the same direction as the temperature dependency of the memory resistor, e.g. for increasing temperature, if the memory resistance decreases, the voltage decreases.

The temperature compensated control circuit can further include a sense amplifier. The sense amplifier can be a comparison circuit to compare the sense signal developed by the memory resistor with a reference signal and to provide an output signal in response to the comparison.

The comparison circuit can include an inverter. The inverter can be considered as a comparison circuit with the reference voltage signal is the built-in toggle voltage of the inverter, typically half of the power supply voltage.

The temperature compensated control circuit is taking input from a temperature dependent element to supply a temperature dependent sensing signal. The temperature dependent element material is preferably made of the same material as the memory resistors. The temperature dependent element material is also preferably fabricated using the same process as the memory resistors. The temperature dependent element in the present invention can also be constructed from any materials that provide a temperature dependent response. A sensitive response is desirable since it would reduce the need for a signal amplifier. The most preferable material is the material used in the fabrication of the memory resistors since it exhibits similar temperature dependence, and offer simplicity in circuit fabrication.

The temperature dependent element can be programmed to any resistance state, and preferably to the low resistance state. Alternatively, the temperature dependent element can be programmed to the high resistance state. In multi-bit states, the temperature dependent element can be programmed to any resistance state, but preferably to the lowest resistance state.

The temperature compensated control circuit can be a current load nMOS transistor circuit or a current source pMOS transistor circuit. The gate bias of the MOS transistor can be a voltage divider employing a temperature dependent element. The saturation current of the MOS transistor varies depending on the resistance of the temperature dependent element to compensate for the resistance variation of the memory resistor.

The memory resistor array of the memory sensing circuit can be a 1R1D (or 1D1R) cross point memory array, or a 1R1T (or 1T1R) random access memory array. The temperature dependent element can further comprise a diode.

The memory resistor can store two-bit resistance states or multi-bit resistance states. The RRAM circuit then comprises appropriate sensing circuit such as two-bit or multi-bit sensing circuit.

In other aspect of the invention, the present invention provides a method to sense a resistance state of a selected memory resistor in a RRAM device with readability improvement against temperature variation. The method comprises the steps of a) providing a temperature compensated reference signal circuit comprising a temperature dependent element;

b) developing a sense signal by applying a sensing signal to the memory resistor;

c) developing at least one temperature dependent reference signal by the temperature compensated reference signal circuit;

d) comparing the sense signal with the at least one reference signal; and e) providing an output signal in response to the comparing step.

The present invention temperature compensated circuit provides a method and apparatus to generate a temperature dependent reference signal that follows the changes of the resistance states to improve the correct detection of resistance states due to temperature variation.

The temperature dependent reference signal can be a temperature dependent voltage signal or a temperature dependent current signal, depending on the selection of the signal comparator in the sensing circuit of a RRAM array.

FIG. 9 shows a conceptual representation of the temperature compensation in the present invention using a temperature dependent reference voltage. The segments 111 and 112 represent the resistances of the low resistance state and the high resistance state respectively. These segments overlap in the regions of low resistance/low temperature and high resistance/high temperature. A constant current source scheme will project in parallel the resistance values to a voltage values segment 113 of low resistance state and a voltage segment 114 of high resistance state. A prior art constant reference signal scheme will not able to correctly detect the resistance states at both high and low temperature regimes.

The present invention temperature dependent reference voltage scheme will follow the resistance states as shown in segment 119. At low temperature, the reference voltage is high, between the values of high and low resistance states, therefore can detect correctly the resistance states of the memory resistor. At high temperature, the reference voltage is low, and again between the values of high and low resistance states, therefore can also detect correctly the resistance states of the memory resistor. The present invention provides a the temperature dependent reference signal tracking the change in resistance states to ensure that the reference signal can be between the two resistance states in the whole operating temperature range. The compensation scheme of the present invention is also well suited to multi-bit state RRAM circuits.

In one aspect of the invention, the present invention provides a temperature compensated reference signal circuit for a RRAM sensing circuit. The temperature dependent reference signal circuit is in communication with a temperature dependent element to generate a temperature dependent reference signal. The temperature dependent reference signal applies to a comparison circuit together with a sense signal developed by the memory resistor. The comparison circuit compares these two signals and generates one output signal in response to the comparison. The output signal is indicative of the resistance state of the memory resistor being sensed.

The temperature dependent reference signal developed by the temperature compensated reference signal circuit can be a temperature dependent voltage source with the temperature dependency of the reference signal is in the same direction as the temperature dependency of the sense voltage of the memory resistor, e.g. for increasing temperature, if the memory resistance decreases, the sense voltage of the memory resistance decreases, then the reference voltage decreases.

The temperature dependent reference signal developed by the temperature compensated reference signal circuit can be a temperature dependent current source with the temperature dependency of the reference signal is in the same direction as the temperature dependency of the sense current of the memory resistor, e.g. for increasing temperature, if the memory resistance decreases, the sense current of the memory resistance increases, then the reference current increases.

The selection of the temperature dependent reference signal (reference voltage or reference current) depends on the sensing signal applied to the memory resistor. If the sensing signal applied to the memory resistor is a current, the sense signal developed by the memory resistor is a sense voltage. Then the reference signal will be a reference voltage, to compare with the sense voltage, and to develop an output signal in response to the comparison. If the sensing signal applied to the memory resistor is a voltage, the sense signal developed by the memory resistor is a sense current. Then the reference signal will be a reference current, to compare with the sense current, and to develop an output signal in response to the comparison.

The temperature compensated reference signal circuit is taking input from a temperature dependent element to supply a temperature dependent reference signal. The temperature dependent element material is preferably made of the same material as the memory resistors. The temperature dependent element material is also preferably fabricated using the same process as the memory resistors. The temperature dependent element in the present invention can also be constructed from any materials that provide a temperature dependent response. The most preferable material is the material used in the fabrication of the memory resistors since it exhibits similar temperature dependence, and offer simplicity in circuit fabrication.

The temperature dependent element can be programmed to any resistance state, and preferably to the low resistance state. Alternatively, the temperature dependent element can be programmed to the high resistance state. In multi-bit states, the temperature dependent element can be programmed to any resistance state, but preferably to the lowest resistance state.

In other aspect of the invention, the present invention provides a method and a circuit comprising a temperature dependent power source to the memory resistor and a temperature dependent reference signal to the memory circuit. The addition of two temperature dependent circuits will add to the complexity of the memory circuit but will give the designer more flexibility to ensure that the memory circuit operates within the entire operating temperature range.

The method comprises the steps of
a) providing a temperature compensated control circuit comprising a first temperature dependent element;
b) providing a temperature compensated reference signal circuit comprising a second temperature dependent element;
c) developing a temperature dependent sensing signal by the temperature compensated control circuit;
d) applying the temperature dependent sensing signal to the memory resistor to generate a sense signal;
e) developing at least one temperature dependent reference signal by the temperature compensated reference signal circuit;
f) comparing the sense signal in step d with the at least one reference signal; and
g) providing an output signal in response to the comparing step.

DETAILED DESCRIPTION OF THE INVENTION

Figure 10:
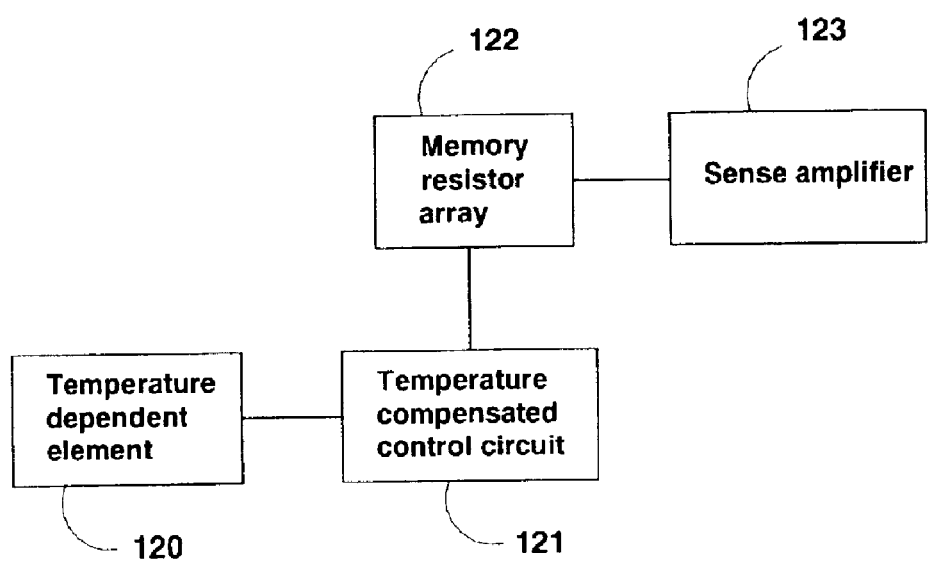
FIG. 10 shows a block diagram of the first embodiment of the present invention.

FIG. 10 shows a block diagram of the first embodiment of the present invention. The embodiment comprises a temperature sensor block 120, providing input to a control circuit block 121. The output of the control circuit block 121 is supplied to the memory resistor array 122 before reaching a sense amplifier block 123.

The temperature sensor block 120 includes a temperature dependent element and necessary circuit to provide a temperature dependent signal to the control circuit block 121. The temperature dependent signal from the temperature sensor circuit can be a voltage or a current, and this signal varies as a function of temperature. The temperature sensor circuit can also include a signal amplifier to amplify the temperature dependent signal.

The control circuit block 121 can include variable current source. The value of the variable current source is controlled by the temperature sensor circuit. The current source then supplies to the memory resistor array 122 to provide a temperature compensated voltage response. The sense amplifier block 123 will amplify and compare the temperature compensated voltage response to a reference voltage to provide a reading output.

The control circuit block 121 can include variable voltage source. The value of the variable voltage source is controlled by the temperature sensor circuit. The voltage source then applies to the memory resistor array 122 to provide a temperature compensated current response. The sense amplifier block 123 will amplify and compare the temperature compensated current response to a reference current to provide a reading output.

Figure 11:
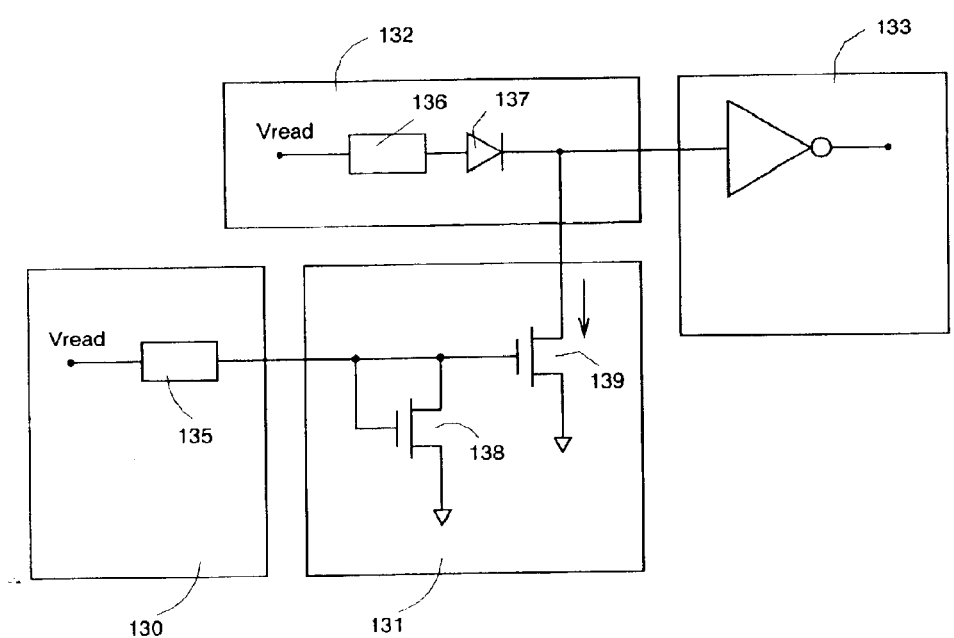
FIG. 11 shows a temperature compensated sensing circuit using current load nMOS according to the first embodiment.

FIG. 11 shows an implementation of the first embodiment of the present invention. The circuit in FIG. 11 is a temperature compensated current load nMOS sensing circuit, comprising a temperature sensor block 130, a control circuit block 131, a memory array block 132 and a sense amplifier block 133.

The temperature sensor block 130 includes a temperature dependent element 135. The temperature dependent element 135 is a temperature sensing resistor that can be made of the same material and process as those of the memory resistors 136 in the memory array 132. The temperature dependent element 135 can be programmed to either a low resistance state or a high resistance state in the case of two-bit memory cells, with a low resistance state is a preferred state. The temperature dependent element 135 can be programmed to any resistance state in the case of multi-bit memory cells, with a lowest resistance state is a preferred state. A diode can be integrated with the temperature dependent element 135 as in the case of the memory resistor array 132 (memory resistor 136 with diode 137), but it is not necessary.

The control circuit block 131 includes a bias nMOS transistor 138 and a current load nMOS transistor 139. The bias transistor 138 has its gate and drain connected together, and acts like a resistor to bias the gate of the current load transistor 139. During a read operation, the read voltage is also applied to the temperature dependent element 135. The temperature dependent element 135 and the bias transistor 138 (acting like a resistor) forms a voltage divider with the divided voltage is the gate voltage of the current load transistor 139. When the temperature increases, the resistance of the temperature dependent element 135 decreases (such as a PCMO resistor, see FIG. 2). With the resistance of the bias transistor 138 remaining constant, the divided voltage applied to the gate of the current transistor 139 increases. With increased bias to the current transistor 139, the operating condition of the current load transistor 139 is shifted, and the current supplied by the current load transistor 139 increases. The increment of this current compensates for the drop in the resistance of the memory resistor 136 due to the increment in temperature, and therefore the voltage supplied to the sense amplifier remains more or less constant. Since the temperature dependent element 135 is identical to the memory resistor, a good tracking of resistance variation due to temperature changes can be achieved.

Figure 3:
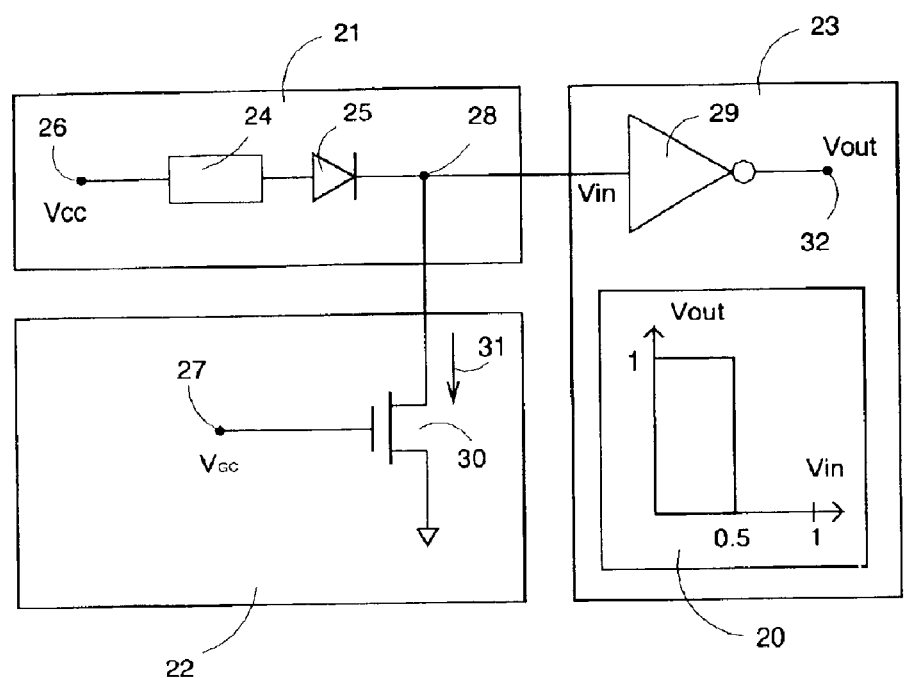
FIG. 3 is a constant current load nMOS transistor sensing circuit for 1R1D RRAM.

The sense amplifier 133 includes a CMOS inverter, similar to the circuit of FIG. 3. The inverter also acts as a voltage comparator with an internal reference voltage. The internal reference voltage is the toggle voltage of the inverter, typically about 0.5V. If the input to the inverter is less than the toggle voltage, the output of the inverter will be high to the power supply voltage. If the input to the inverter is higher than the toggle voltage, the output of the inverter will be low to the ground potential.

Figure 4:
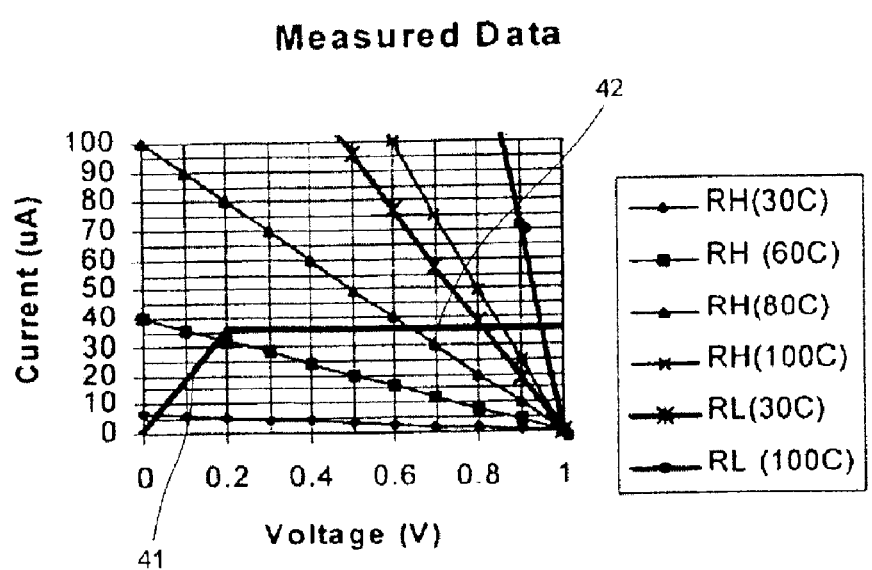
FIG. 4 is an output response of the sensing circuit biased to low temperature regime.
Figure 5:
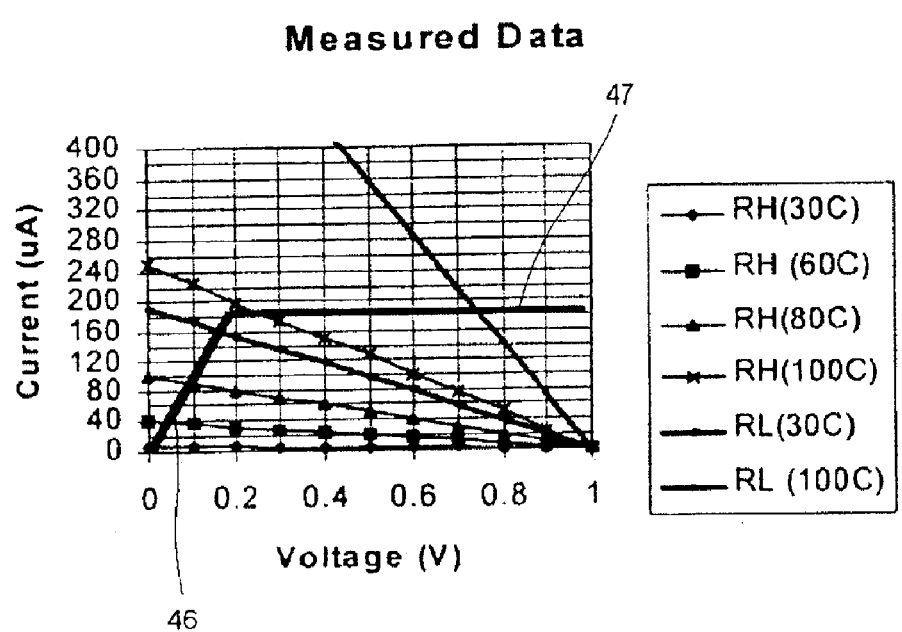
FIG. 5 is an output response of the sensing circuit biased to high temperature regime.
Figure 6:
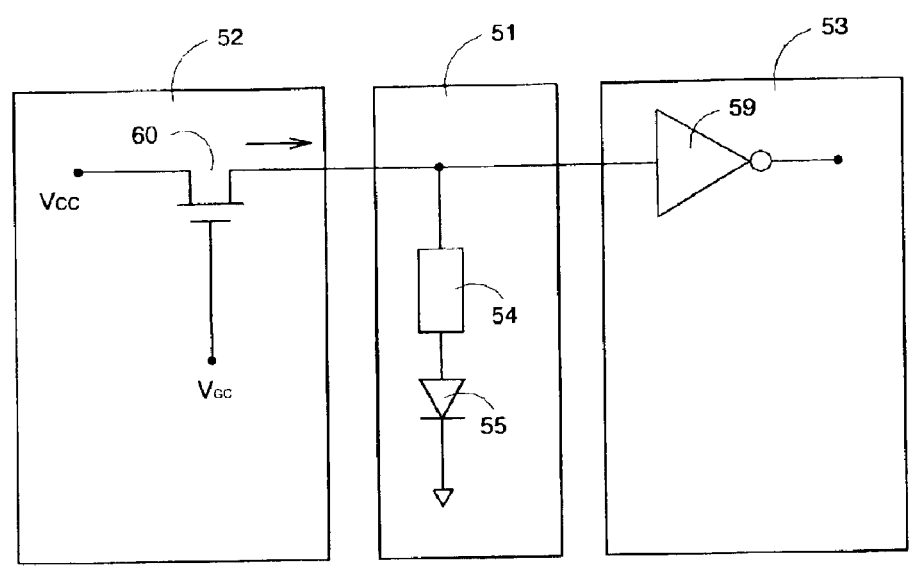
FIG. 6 is a constant current source pMOS transistor sensing circuit for 1R1D RRAM.
Figure 7:
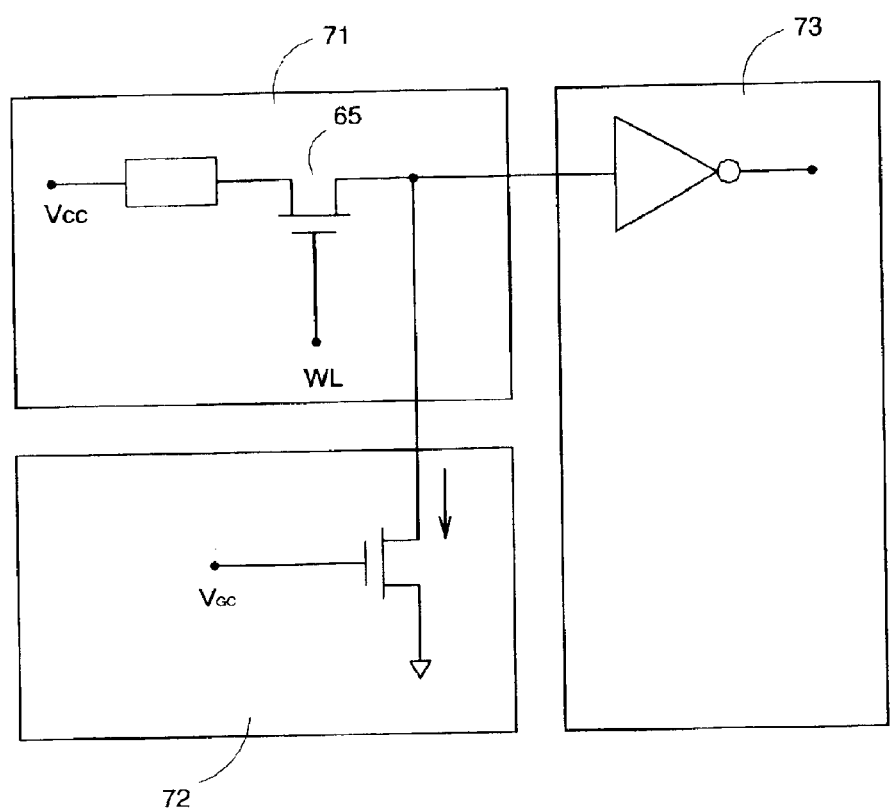
FIG. 7 is a constant current load nMOS transistor sensing circuit for 1R1T RRAM.
Figure 8:
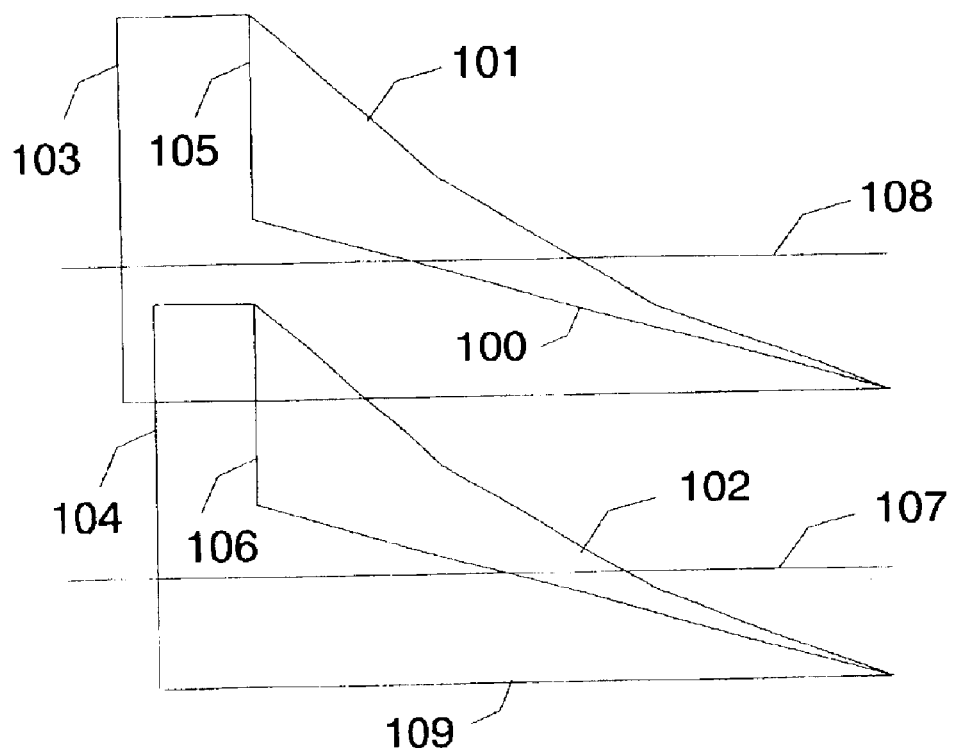
FIG. 8 is the present invention concept of using a temperature dependent power source to compensate for the variation in resistance of the memory resistor.
Figure 9:
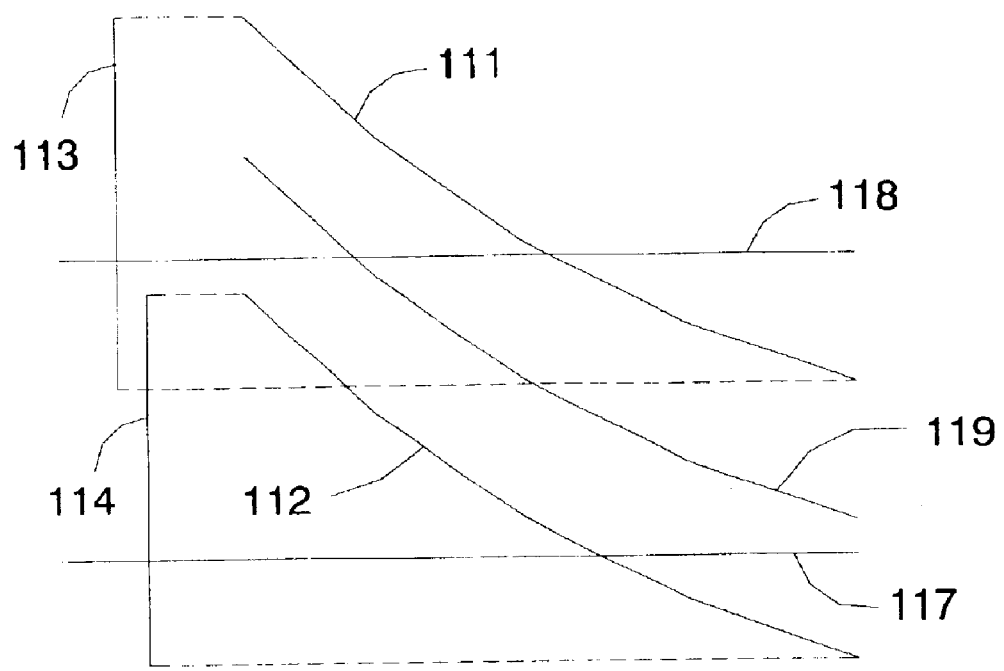
FIG. 9 is the present invention concept of using a temperature dependent reference signal to compensate for the variation in resistance of the memory resistor.
Figure 12:
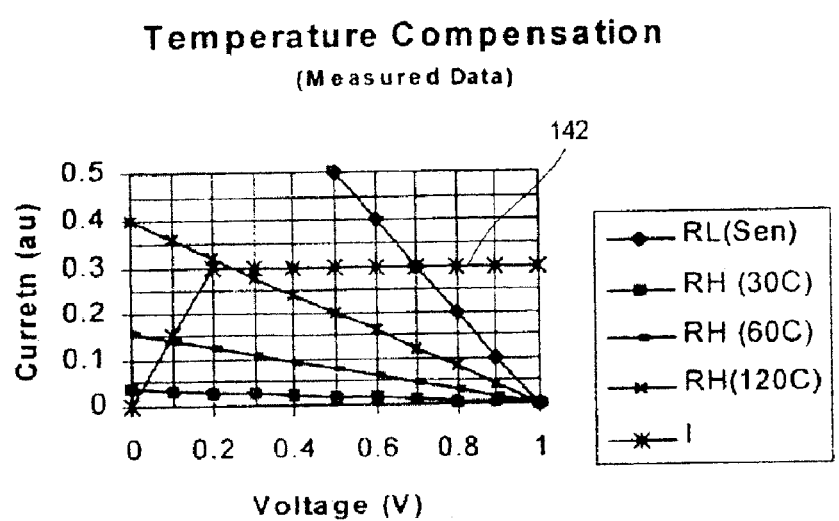
FIG. 12 is an output response of the temperature compensated sensing circuit in FIG. 11.

FIG. 12 is an output response of the temperature compensated sensing circuit of FIG. 11. The data used in this figure is the same data used in FIGS. 4 and 5, with the temperature dependent element 135 sets to the low resistance state. Since the temperature dependent element 135 is identical to the low resistance state of the memory resistor, the gate voltage $V_G$ of the bias transistor 138 tracks with temperature and is always at $$V_G = V_{DSAT} + V_{TH}$$

with $V_{DSAT}$ is the saturation voltage and $V_{TH}$ is the threshold voltage of the transistor 138, and both are a weak function of temperature.

The output response curve 142 in FIG. 12 is a normalized response curve since the current through the memory resistor varies with temperature. Similarly, the memory resistor load lines in FIG. 12 are drawn from the effective resistance of the memory resistor. The effective resistance is calculated by dividing the voltage across the memory resistor by the normalized current with the voltage across the memory resistor is the product of the resistance times the temperature compensated current of the memory resistor. The temperature compensated circuit of FIG. 11 is able to sense the bit memory content within the operating temperature range of 30° C. to 120° C. with a large margin.

Figure 13:
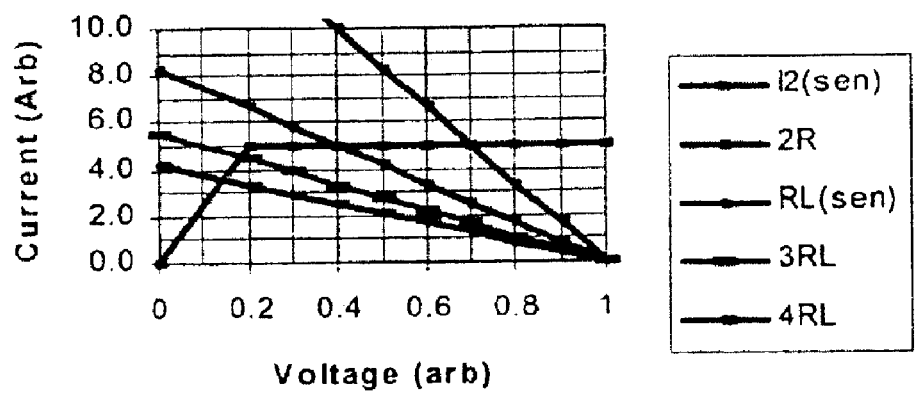
FIG. 13 is a design criterion for an optimized output response of the temperature compensated sensing circuit in FIG. 11.

FIG. 13 represents the criterion in designing the temperature compensated circuit of the present invention. The effect of the temperature compensated circuit is to increase the effective resistance of the memory resistor by increasing the current through the memory resistor. This increment of the effective resistance in high resistance state will raise the resistance of the high resistance state, and at the same time, will raise the resistance of the low resistance state. The temperature compensated circuit will able to resolve the low resistance state and the high resistance at all operating temperature as long as the high resistance state is at least two times (2×) higher than the low resistance state.

The performance of the temperature compensated sensing circuit can be further optimized by the optimization of the device size of transistors 138 and 139.

Figure 14:
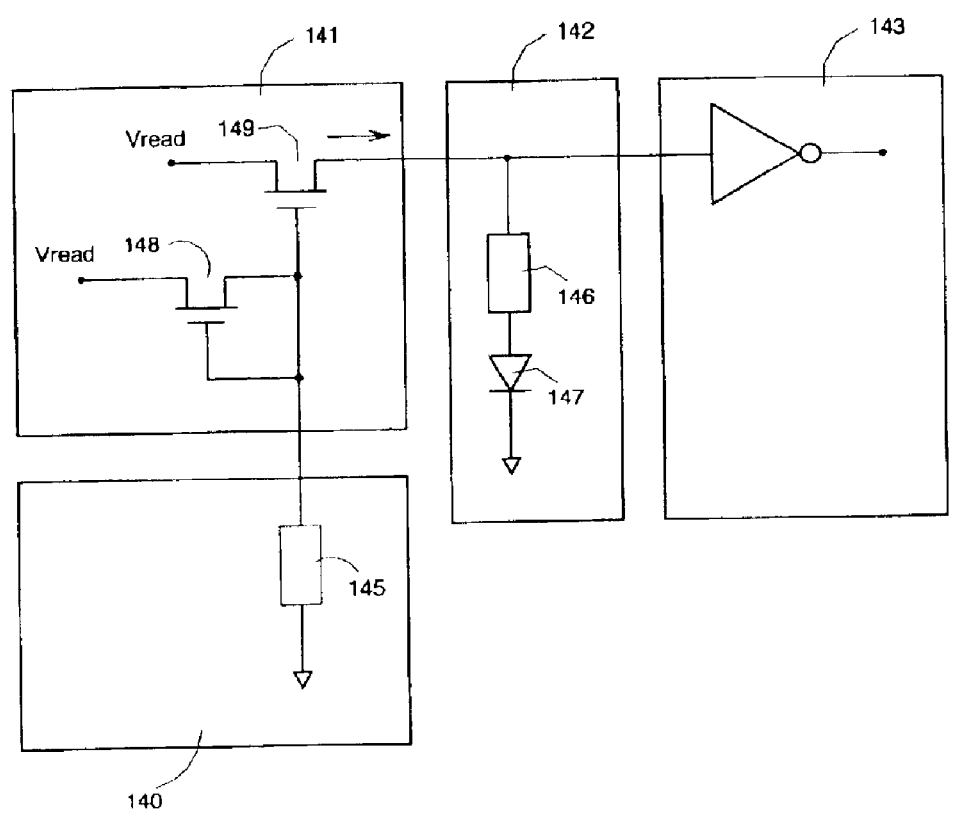
FIG. 14 shows a temperature compensated sensing circuit using current source pMOS according to the first embodiment.

FIG. 14 shows another implementation of the first embodiment of the present invention. The circuit in FIG. 14 is a temperature compensated current source pMOS bit sensing circuit, comprising a temperature sensor block 140, a control circuit block 141, a memory array block 142 and a sense amplifier block 143.

The temperature sensor block 140 includes a temperature dependent element 145. The temperature dependent element 145 is a temperature sensing resistor that can be made of the same material and process as those of the memory resistors 146 in the memory array 142. The temperature dependent element 145 can be programmed to either a low resistance state or a high resistance state in the case of two-bit memory cells, with a low resistance state is a preferred state. The temperature dependent element 145 can be programmed to any resistance state in the case of multi-bit memory cells, with a lowest resistance state is a preferred state. A diode can be integrated with the temperature dependent element 145 as in the case of the memory resistor array 142 (memory resistor 146 with diode 147), but it is not necessary.

The control circuit block 141 includes a bias pMOS transistor 148 and a current source pMOS transistor 149. The bias transistor 148 has its gate and drain connected together, and acts like a resistor to bias the gate of the current load transistor 149. During a read operation, the read voltage is also applied to the temperature dependent element 145. The temperature dependent element 145 and the bias transistor 148 (acting like a resistor) forms a voltage divider with the divided voltage is the gate voltage of the current load transistor 149. When the temperature increases, the resistance of the temperature dependent element 145 decreases (such as a PCMO resistor, see FIG. 2). With the resistance of the bias transistor 148 remaining constant, the divided voltage applied to the gate of the current transistor 149 decreases. With decreased bias to the current transistor 149, the operating condition of the current source transistor 149 is shifted, and the current supplied by the current source transistor 149 increases. The increment of this current compensates for the drop in the resistance of the memory resistor 146 due to the increment in temperature, and therefore the voltage supplied to the sense amplifier increases. Since the temperature dependent element 145 is identical to the memory resistor, a good tracking of resistance variation due to temperature changes can be achieved.

The sense amplifier 143 includes a CMOS inverter, similar to the circuit of FIG. 11. The inverter also acts as a voltage comparator with an internal reference voltage. The internal reference voltage is the toggle voltage of the inverter, typically about 0.5V. If the input to the inverter is less than the toggle voltage, the output of the inverter will be high to the power supply voltage. If the input to the inverter is higher than the toggle voltage, the output of the inverter will be low to the ground potential.

Figure 15:
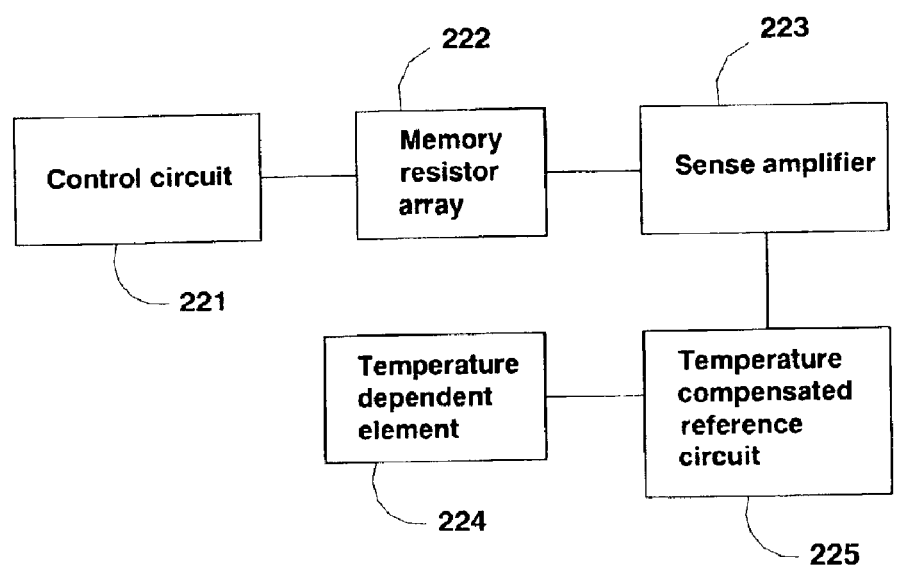
FIG. 15 shows a block diagram of the second embodiment of the present invention.

FIG. 15 shows a block diagram of the second embodiment of the present invention. The embodiment comprises a control circuit block 221 supplying to the memory resistor array 222 before reaching a sense amplifier block 223. The sense amplifier block 223 received a reference signal from a temperature compensated reference signal circuit 225. The temperature compensated reference signal circuit 225 is taking a temperature dependent signal input from a temperature sensor 224 to control the reference signal.

The temperature sensor block 224 includes a temperature dependent element and necessary circuit to provide a temperature dependent signal to the temperature compensated reference signal circuit 225. The temperature dependent signal from the temperature sensor circuit can be a voltage or a current, and that this signal varies as a function of temperature. The temperature sensor circuit can also include a signal amplifier to amplify the temperature dependent signal.

The temperature compensated reference signal circuit 225 can include variable voltage or current source. The value of the variable voltage or current source is controlled by the temperature sensor circuit. The voltage or current source then supplies to the sense amplifier block 223 to provide a temperature compensated reference signal. The temperature compensated reference signal can be a reference voltage or a reference current, depending on the selection of a comparator circuit in the sense amplifier circuit block 223. The sense amplifier block 223 will amplify and compare the response from the memory array 222 to the temperature compensated reference signal from the temperature compensated reference signal circuit 225 to provide a reading output.

Figure 16:
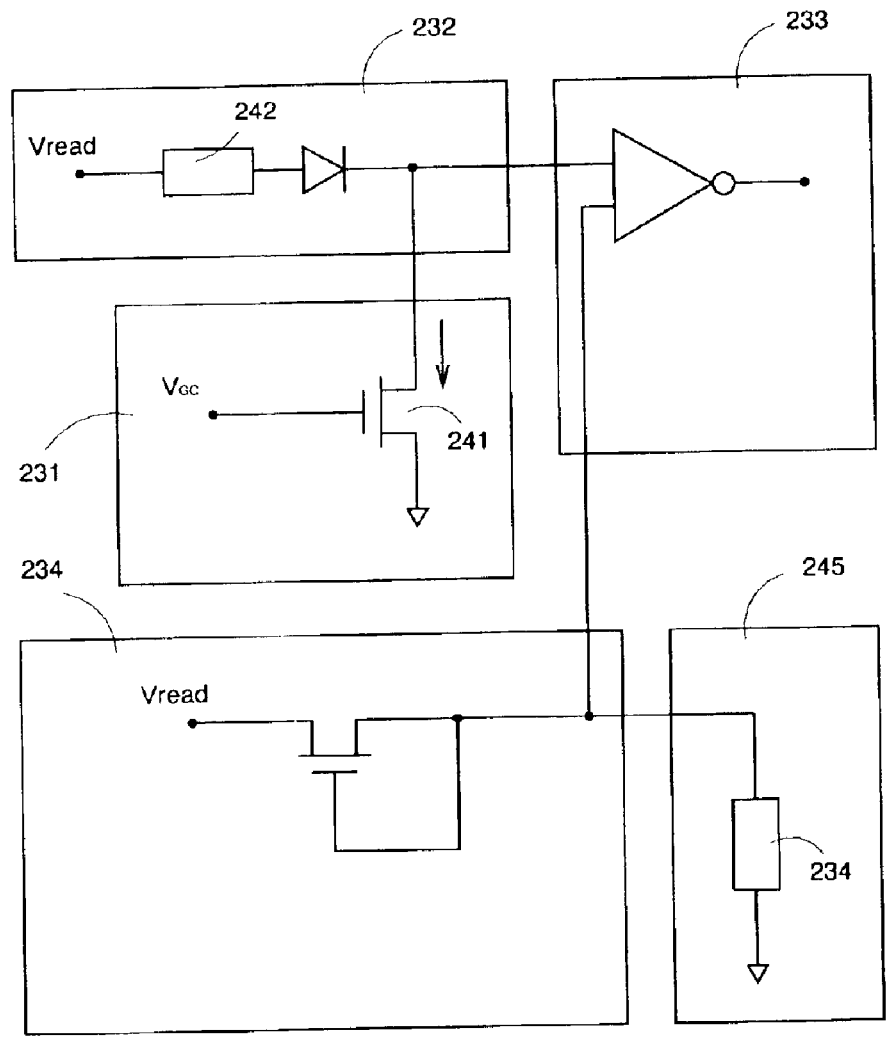
FIG. 16 shows an implementation of the second embodiment of the present invention using a temperature compensated reference voltage signal.

FIG. 16 shows an implementation of the second embodiment of the present invention using a temperature compensated reference voltage signal. The embodiment comprises a control circuit block 231 supplying to the memory resistor array 232 before reaching a sense amplifier block 233. The sense amplifier block 233 received a reference voltage signal from a temperature compensated reference voltage signal circuit 235. The temperature compensated reference voltage signal circuit 235 is taking a temperature dependent voltage signal input from a temperature sensor 234 to control the reference voltage signal.

Figure 1:
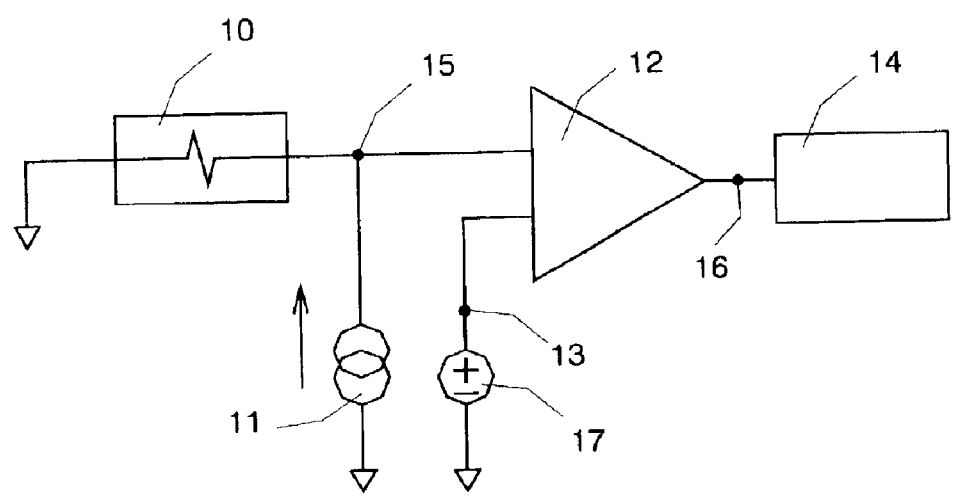
FIG. 1 is a prior art basic reading circuit using a constant current scheme.
Figure 2A:
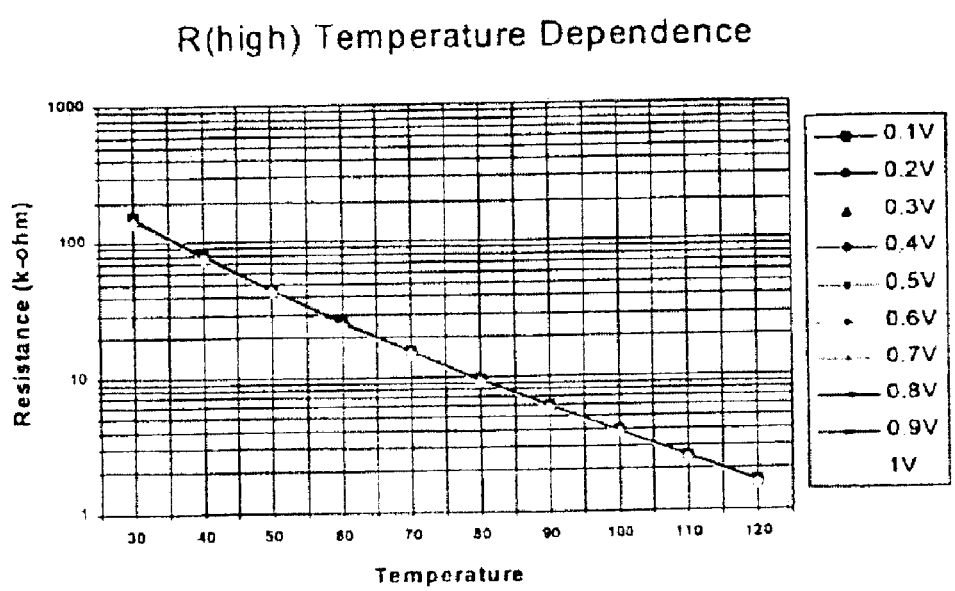
FIG. 2a is the temperature dependence of a PCMO memory resistor programmed to high resistance state.
Figure 2B:
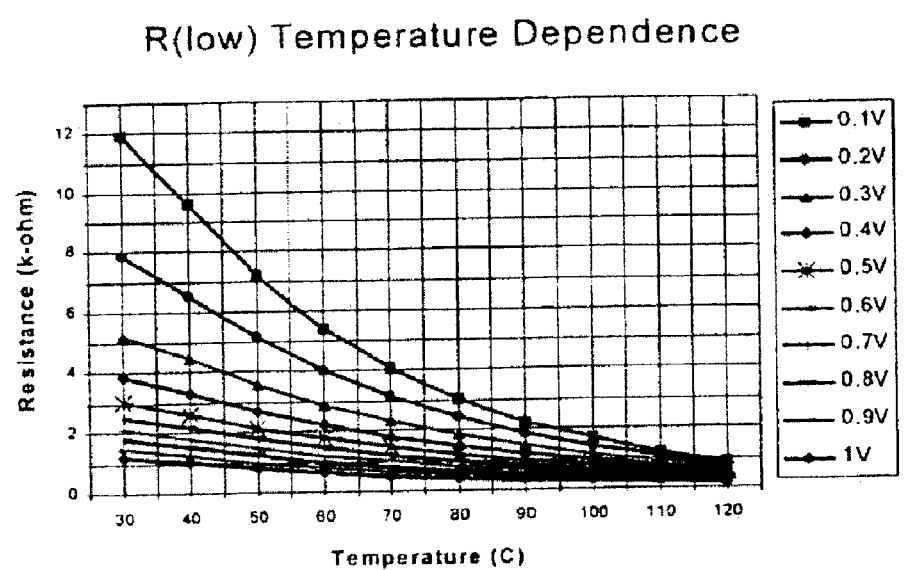
FIG. 2b is the temperature dependence of a PCMO memory resistor programmed to low resistance state.

The control circuit block 231 supplies a constant current through the bias voltage $V_{GC}$ to the constant current transistor 241. Since the current supply is constant, the voltage drop through the memory resistor 242 will decrease when the temperature increases (following the response of PCMO material with temperature as shown in FIG. 2). The temperature dependent element 243 of the temperature sensor block 134 will cause a drop in resistance with high temperature, and therefore a drop in reference voltage signal because of the voltage divider circuit of the temperature compensated reference voltage signal circuit 235. The bias transistor 245 of the temperature compensated reference voltage signal circuit 235 acts as a resistor (with the drain and the gate connected together) to provide the voltage divider circuit for the reference voltage.

Since the temperature dependent element 243 is made of the same material as the memory resistor, the reference voltage supplied to the comparator of the sense amplifier tracks well with the memory resistor input, and therefore the voltage comparator can be compensated for the changes in resistance of the memory resistor due to temperature changes.

Figure 17:
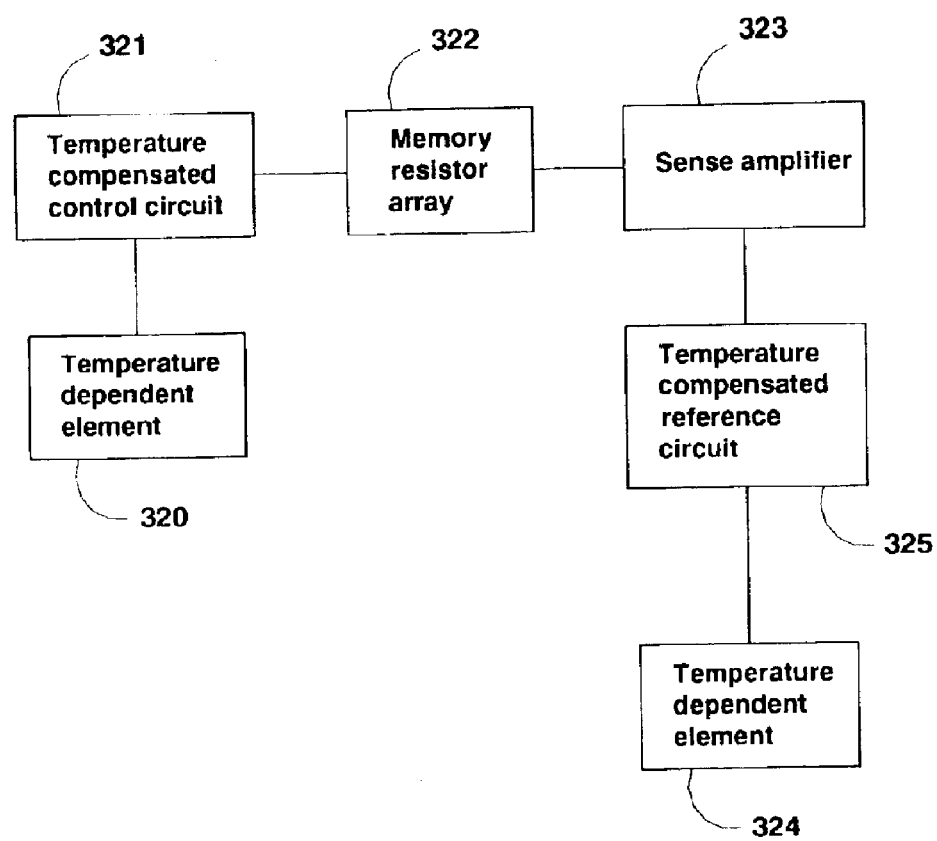
FIG. 17 shows a block diagram of the third embodiment of the present invention.

FIG. 17 shows a block diagram of the third embodiment of the present invention. The embodiment comprises a first temperature sensor block 320, providing input to a control circuit block 321. The output of the control circuit block 321 is supplied to the memory resistor array 322 before reaching a sense amplifier block 323. The sense amplifier block 323 received a reference signal from a temperature compensated reference signal circuit 325. The temperature compensated reference signal circuit 325 is taking a temperature dependent signal input from a second temperature sensor 324 to control the reference signal.

The first temperature sensor block 320 includes a temperature dependent element and necessary circuit to provide a temperature dependent signal to the control circuit block 321. The temperature dependent signal from the temperature sensor circuit can be a voltage or a current, and that this signal varies as a function of temperature. The temperature sensor circuit can also include a signal amplifier to amplify the temperature dependent signal.

The control circuit block 321 can include variable current source. The value of the variable current source is controlled by the temperature sensor circuit. The current source then supplies to the memory resistor array 322 to provide a temperature compensated voltage response. The sense amplifier block 323 will amplify and compare the temperature compensated voltage response to a reference voltage to provide a reading output.

The control circuit block 321 can include variable voltage source. The value of the variable voltage source is controlled by the temperature sensor circuit. The voltage source then applies to the memory resistor array 322 to provide a temperature compensated current response. The sense amplifier block 323 will amplify and compare the temperature compensated current response to a reference current to provide a reading output.

The second temperature sensor block 324 includes a temperature dependent element and necessary circuit to provide a temperature dependent signal to the temperature compensated reference signal circuit 325. The temperature dependent signal from the temperature sensor circuit can be a voltage or a current, and that this signal varies as a function of temperature. The temperature sensor circuit can also include a signal amplifier to amplify the temperature dependent signal.

The temperature compensated reference signal circuit 325 can include variable voltage or current source. The value of the variable voltage or current source is controlled by the temperature sensor circuit. The voltage or current source then supplies to the sense amplifier block 323 to provide a temperature compensated reference signal. The temperature compensated reference signal can be a reference voltage or a reference current, depending on the selection of a comparator circuit in the sense amplifier circuit block 323. The sense amplifier block 323 will amplify and compare the response from the memory array 322 to the temperature compensated reference signal from the temperature compensated reference signal circuit 325 to provide a reading output.

The circuit implementations are just a representative of the circuit blocks of the numerous embodiments of the present invention. It will be appreciated that further variations and modifications of the circuits can be made within the scope of the present invention as described in the circuit blocks.

Figure 18:
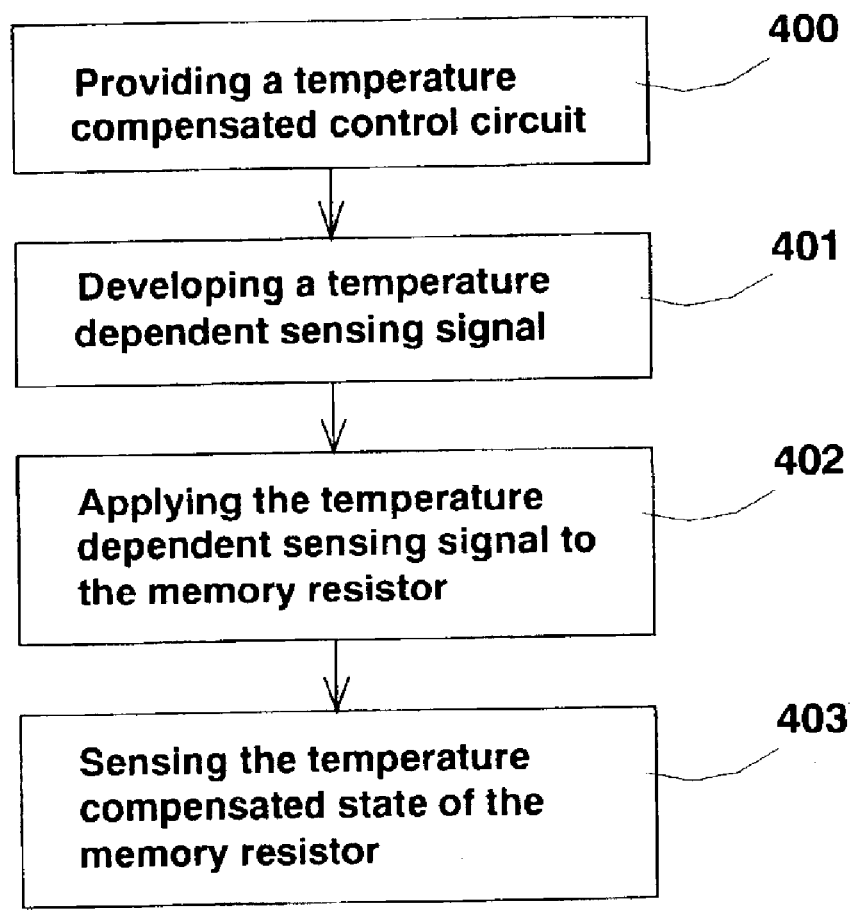
FIG. 18 shows a method using a temperature compensated control circuit according to the present invention.

FIG. 18 shows a method using a temperature compensated control circuit according to the present invention. Step 400 provides a temperature compensated control circuit comprising a temperature dependent element. The temperature dependent element provides input to the temperature compensated control circuit. Step 401 generates at least one temperature dependent sensing signal by the temperature compensated control circuit. The sensing signal is a function of temperature. Step 402 applies the at least one temperature dependent sensing signal to the memory resistor to compensate for the temperature variation of the resistance of the memory resistor. And step 403 senses the compensated state of the memory resistor.

Figure 19:
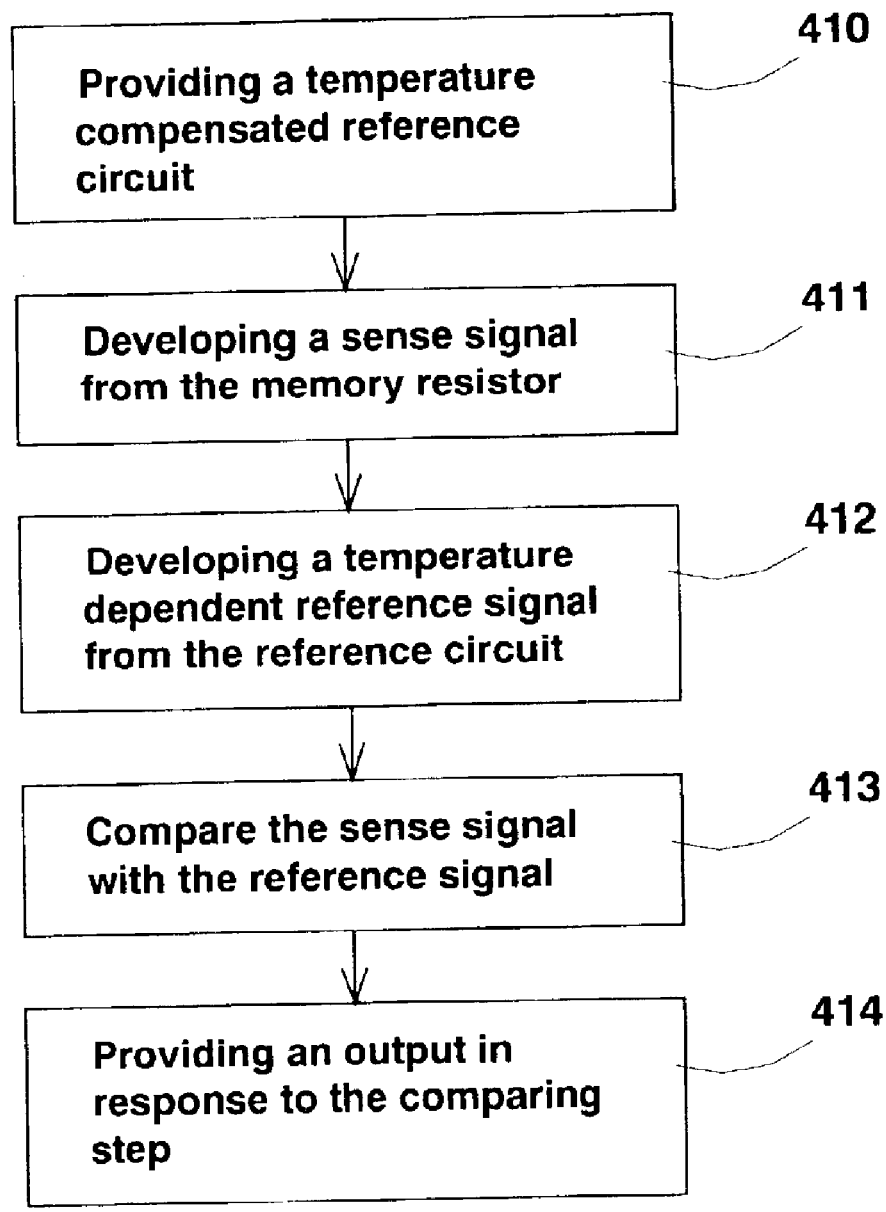
FIG. 19 shows a method using a temperature compensated reference signal circuit according to the present invention.

FIG. 19 shows a method using a temperature compensated reference signal circuit according to the present invention. Step 410 provides a temperature compensated reference signal circuit comprising a temperature dependent element. The temperature dependent element provides input to the temperature compensated control circuit. Step 411 generates a sense signal by applying a sensing signal to the memory resistor. Step 412 generates at least one temperature dependent reference signal by the temperature compensated reference signal circuit. Step 413 compares the sense signal with the at least one reference signal. And step 414 provides an output signal in response to the comparing step.

Figure 20:
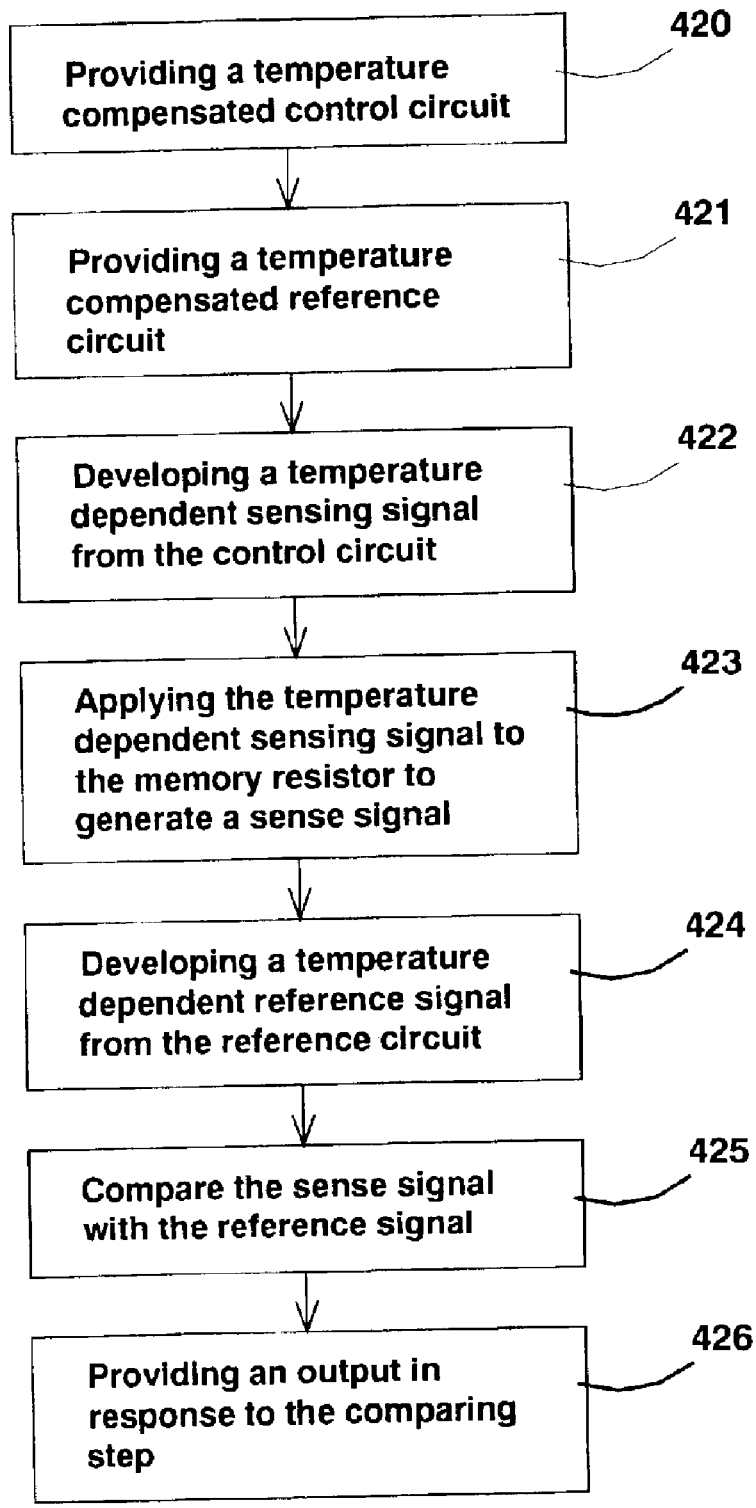
FIG. 20 shows a method using a temperature compensated control circuit together with a temperature compensated reference signal circuit according to the present invention.

FIG. 20 shows a method using a temperature compensated control circuit together with a temperature compensated reference signal circuit according to the present invention. Step 420 provides a temperature compensated control circuit comprising a first temperature dependent element. Step 421 provides a temperature compensated reference signal circuit comprising a temperature dependent element. Step 422 generates a temperature dependent sensing signal by the temperature compensated control circuit. Step 423 applies the temperature dependent sensing signal to the memory resistor to generate a sense signal. Step 424 generates at least one temperature dependent reference signal by the temperature compensated reference signal circuit. Step 425 compares the sense signal in step d with the at least one reference signal. And step 426 provides an output signal in response to the comparing step.

What is claimed is:

1. A temperature compensated RRAM sensing circuit to improve the readability against temperature variations, the circuit comprising:

a) a temperature dependent memory resistor array;

b) a temperature dependent element;

c) a temperature compensated control circuit in communication with the temperature dependent element arid to provide at least one temperature dependent output signal to the temperature dependent memory resistor to compensate for the temperature variation of the resistance of the memory resistor; and wherein the temperature dependent element is fabricated from the same material and process as the memory resistor.

2. A circuit as in claim 1, wherein the temperature dependent output signal developed by the temperature compensated control circuit is a temperature dependent current source, the temperature dependency of the current source being in the opposite direction as the temperature dependency of the memory resistor so that the voltage across the memory resistor is compensated against temperature variations.

3. A circuit as in claim 1, wherein the temperature dependent output signal developed by the temperature compensated control circuit is a temperature dependent voltage source, the temperature dependency of the voltage source being in the same direction as the temperature dependency of the memory resistor so that the current across the memory resistor is compensated against temperature variations.

4. A circuit as in claim 1, further comprising a sense amplifier, the sense amplifier comprising an inverter.

5. A circuit as in claim 1, further comprising a sense amplifier, the sense amplifier comprising a comparison circuit.

6. A circuit as in claim 1, wherein the temperature dependent element is programmed to the lowest resistance state.

7. A circuit as in claim 1, wherein the temperature compensated control circuit is a current load nMOS circuit.

8. A circuit as in claim 1, wherein the temperature compensated control circuit is a current load pMOS circuit.

9. A circuit as in claim 1, wherein the memory resistor array is a 1R1D cross point memory array.

10. A circuit as in claim 1, wherein the memory resistor array is a 1R1T random access memory array.

11. A circuit as in claim 1, further comprising a diode connecting to the temperature dependent element.

12. A circuit as in claim 1, wherein the memory resistor array stores two-bit resistance states.

13. A circuit as in claim 1, wherein the memory resistor array stores multi-bit resistance states.

14. A circuit as in claim 13, further comprising a multi-bit sensing circuit.

15. A method to sense a resistance state of a selected memory resistor in an RRAM device to improve the readability against temperature variation, the method comprising the steps of:

a) providing a temperature compensated control circuit comprising a temperature dependent element;

b) developing at least one temperature dependent sensing signal by the temperature compensated control circuit;

c) applying the at least one temperature dependent sensing signal to the memory resistor to compensate for the temperature variation of the resistance of the memory resistor;

d) sensing the compensated state of the memory resistor; and wherein the temperature dependent element is fabricated from the same material and process as the memory resistor.

16. A method as in claim 15, wherein the temperature dependent sensing signal is a current source and the compensated state of the memory resistor is the voltage across the memory resistor.

17. A method as in claim 15, wherein the temperature dependent sensing signal is a voltage source and the compensated state of the memory resistor is the current through the memory resistor.

18. A temperature compensated RRAM sensing circuit to improve the readability against temperature variations, the circuit comprising:
   a) a temperature dependent memory resistor array;
   b) a temperature dependent element;
   c) a temperature compensated control circuit in communication with the temperature dependent element arid to provide at least one temperature dependent output signal to the temperature dependent memory resistor to compensate for the temperature variation of the resistance of the memory resistor; and
   wherein the temperature dependent output signal developed by the temperature compensated control circuit is a temperature dependent current source, the temperature dependency of the current source being in the opposite direction as the temperature dependency of the memory resistor so that the voltage across the memory resistor is compensated age net temperature variations.

19. A temperature compensated RRAM sensing circuit to improve the readability against temperature variations, the circuit comprising:
   a) a temperature dependent memory resistor array;
   b) a temperature dependent element;
   c) a temperature compensated control circuit in communication with the temperature dependent element arid to provide at least one temperature dependent output signal to the temperature dependent memory resistor to compensate for the temperature variation of the resistance of the memory resistor; and
   wherein the temperature dependent output signal developed by the temperature compensated control circuit is a temperature dependent voltage source, the temperature dependency of the voltage source being in the same direction as the temperature dependency of the memory resistor so that the current across the memory resistor is compensated against temperature variations.

20. A temperature compensated RRAM sensing circuit to improve the readability against temperature variations, the circuit comprising:
   a) a temperature dependent memory resistor array;
   b) a temperature dependent element;
   c) a temperature compensated control circuit in communication with the temperature dependent element arid to provide at least one temperature dependent output signal to the temperature dependent memory resistor to compensate for the temperature variation of the resistance of the memory resistor; and
   wherein the temperature compensated control circuit is a current load nMOS circuit.

21. A temperature compensated RRAM sensing circuit to improve the readability against temperature variations, the circuit comprising:
   a) a temperature dependent memory resistor array;
   b) a temperature dependent element;
   c) a temperature compensated control circuit in communication with the temperature dependent element arid to provide at least one temperature dependent output signal to the temperature dependent memory resistor to compensate for the temperature variation of the resistance of the memory resistor; and
   wherein the temperature compensated control circuit is a current source pMOS circuit.

22. A temperature compensated RRAM sensing circuit to improve the readability against temperature variations, the circuit comprising:
   a) a temperature dependent memory resistor array;
   b) a temperature dependent element;
   c) a temperature compensated control circuit in communication with the temperature dependent element arid to provide at least one temperature dependent output signal to the temperature dependent memory resistor to compensate for the temperature variation of the resistance of the memory resistor; and
   d) a diode connecting to the temperature dependent element.

* * * * *